United States Patent
Hayashi et al.

(10) Patent No.: US 6,995,650 B2
(45) Date of Patent: Feb. 7, 2006

(54) ELECTRICAL PART PREVENTED FROM IMPROPER MOUNTING ON CIRCUIT BOARD, AND MOUNTING STRUCTURE FOR THE ELECTRICAL PART

(75) Inventors: Hideyasu Hayashi, Miyagi-ken (JP); Hiroshi Ohara, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 203 days.

(21) Appl. No.: 10/655,879

(22) Filed: Sep. 5, 2003

(65) Prior Publication Data
US 2004/0052010 A1 Mar. 18, 2004

(30) Foreign Application Priority Data
Sep. 17, 2002 (JP) .............................. 2002-270284

(51) Int. Cl.
*H01C 10/00* (2006.01)

(52) U.S. Cl. ....................... 338/162; 338/197; 338/160

(58) Field of Classification Search ................ 338/160, 338/162, 197
See application file for complete search history.

(56) References Cited

U.S. PATENT DOCUMENTS

| | | | | |
|---|---|---|---|---|
| 2,740,026 A | * | 3/1956 | Budd et al. .................. | 338/197 |
| 2,740,027 A | * | 3/1956 | Budd et al. .................. | 338/162 |
| 3,420,946 A | * | 1/1969 | Yungblut ..................... | 338/160 |
| 3,493,914 A | * | 2/1970 | Campbell .................... | 338/162 |
| 3,525,067 A | * | 8/1970 | Bang .......................... | 338/197 |
| 3,531,076 A | * | 9/1970 | Bang .......................... | 338/197 |
| 4,251,796 A | * | 2/1981 | Soeda et al. ................. | 338/160 |
| 4,297,671 A | * | 10/1981 | Flanders ..................... | 338/200 |
| 5,546,067 A | * | 8/1996 | Schmidt et al. ............. | 338/172 |
| 5,967,837 A | * | 10/1999 | Wolfe et al. | |
| 6,049,044 A | | 4/2000 | Mizobuchi | |
| 6,392,168 B2 | | 5/2002 | Takahashi et al. | |

* cited by examiner

*Primary Examiner*—Karl D. Easthom
(74) *Attorney, Agent, or Firm*—Beyer, Weaver & Thomas

(57) ABSTRACT

A mounting structure is provided to mount, on the same circuit board, two types of electrical parts in each of which an operating member is rotatably supported by a housing including sliders and a conductive pattern, such as a contact pattern, and which are similar in arrangement of terminals to extend terminal-insertion holes of the circuit board. Each of the electrical parts has a positioning protrusion protruding from its bottom face, and the position of the positioning protrusion differs according to the type of the electrical part. In a mounting region of the circuit board for each electrical part, a positioning hole is provided in which only the positioning protrusion of the corresponding electrical part can be inserted. Preferably, the positioning protrusion protrudes from a bottom face of a bottom plate member attached at the bottom of the housing.

5 Claims, 4 Drawing Sheets

ELECTRICAL PART PREVENTED FROM IMPROPER MOUNTING ON CIRCUIT BOARD, AND MOUNTING STRUCTURE FOR THE ELECTRICAL PART

BACKGROUND OF THE INVENTION

1. Field of the Invention

The present invention relates to an electrical part with terminals, such as an encoder or a variable resistor, and to a structure for mounting the electrical part on a circuit board. More particularly, the present invention relates to a structure for mounting electrical parts of different types, which are similar in terminal arrangement, on the same circuit board.

2. Description of the Related Art

An electrical part with an operating member to be rotated, such as an encoder or a variable resistor, incorporates a slider and a conductive pattern on which the slider slides. The electrical part also has a plurality of terminals protruding outward therefrom. During mounting, the terminals are passed through terminal-insertion holes provided in a circuit board, and are soldered to an external circuit. The operating member is rotatable together with the slider or the conductive pattern. For example, in an encoder, a slider moves into contact with and away from a contact pattern with the rotation of an operating member, thereby outputting pulse signals. In a variable resistor, a slider slides on a resistor pattern with the rotation of an operating member, thereby changing the output resistance. In a case in which a push switch is provided under the operating member, the operating member can be not only rotated, but be pressed, and the push switch can be turned on by pressing down the operating member.

The type of such an electrical part, for example, an encoder can be changed only by using a contact pattern with a comb pattern having a different pitch. The type of a variable resistor can be changed only by using a resistor pattern having a different resistance characteristic. Therefore, multiple types of electrical parts can be produced at low cost without changing the basic configuration, and are widely used in various fields. For example, a common housing including a slider, terminals, and so on can be applied to a plurality of types of encoders which are different in the total number of pulses and in which a code plate having a contact pattern can rotate together with an operating member. In addition, since the housing can be insert-molded with a hoop material, the parts cost can be reduced substantially.

As described above, the electrical parts that are different in the total number of pulses can share the housing including a slider, terminals, and so on, and therefore, the cost can be reduced. However, problems arise because the electrical parts of different types are similar in appearance. That is, in a case in which electrical parts of different types that have similar terminal arrangements are mounted on the same circuit board, since terminal-insertion holes are similarly arranged in mounting regions corresponding to the electrical parts, terminals of an electrical part may be smoothly inserted in terminal-insertion holes provided in a wrong mounting region. This increases the danger of improperly mounting electrical parts. Furthermore, since mounting operation must be performed with the greatest care in order to prevent such improper mounting, working efficiency is reduced.

SUMMARY OF THE INVENTION

The present invention has been made in view of such circumstances, and a first object of the present invention is to provide an electrical part that can be easily and precisely mounted at a given position without being confused with another type of electrical part that has a similar terminal arrangement. A second object of the present invention is to provide a mounting structure that allows electrical parts of different types having similar terminal arrangements to be mounted easily and precisely.

In order to achieve the above first object, according to an aspect, the present invention provides an electrical part including a housing to be placed on a circuit board during mounting, a slider and a conductive pattern disposed inside the housing, the slider sliding on the conductive pattern, a plurality of terminals protruding outward from the housing to extend through terminal-insertion holes provided in the circuit board, an operating member supported by the housing so as to rotate together with the slider or the conductive pattern, and a bottom plate member disposed on a bottom portion of the housing, and having at least one positioning protrusion protruding corresponding to a positioning hole of the circuit board, wherein the electrical part is mounted by fitting the positioning protrusion in the positioning hole so that the bottom plate member opposes the circuit board.

In such a case in which the bottom plate member having the positioning protrusion is attached to the bottom portion of the housing of the electrical part, the position of the positioning protrusion is made different from that in another electrical part so that the positioning protrusion can be inserted only in a corresponding positioning hole provided in a predetermined mounting region. This prevents electrical parts of different types having similar terminal arrangements from being confused and improperly mounted. Therefore, mounting operation can be performed easily and precisely. Moreover, since the electrical parts can be differentiated with the shape of the bottom plate member attached to the bottom portion of the housing, they can share the housing including a slider, terminals, and so on, and a cost merit will not be reduced.

Preferably, a bottom face of the housing has an aperture through which the slider is exposed, and the bottom plate member closes the aperture. In this case, the bottom plate member functions as a bottom cover for closing the aperture. That is, in an electric part having a structure in which a bottom portion of the slider is embedded in the bottom portion of the housing by insert molding, the bottom face of the housing needs to have an aperture in order to subject the slider to, for example, bending. It is preferable that the aperture be closed by a bottom cover to prevent the entry of flux or the like during soldering. Accordingly, improper mounting can be prevented at low cost without increasing the number of components, by providing the positioning protrusion on the bottom plate member serving as the bottom cover.

Preferably, the positioning protrusion comprises a plurality of positioning protrusion protruding from the bottom plate member, and a positioning protrusion protruding at the center of the bottom plate member is fitted in a corresponding positioning hole provided in the circuit board. In this case, the central positioning protrusion allows the electrical part to be precisely positioned with respect to the circuit board. However, since the electrical part cannot be differentiated from another electrical part with the central positioning protrusion, the position of the other positioning protrusion is appropriately changed depending on the type of the electrical part. Even when the electrical part has only one positioning protrusion protruding from the bottom plate member, as long as the positioning protrusion is provided apart from the center of the bottom plate member, it can perform both a function of positioning relative to the circuit board and a function of preventing improper mounting.

In order to achieve the second object, according to another aspect, the present invention provides an electrical-part mounting structure for mounting electrical parts of different types on a circuit board, wherein each of the electrical parts includes a slider, a conductive pattern on which the slider slides, and an operating member rotatable together with the slider or the conductive pattern, wherein terminals of the electrical parts have similar arrangements and extend through terminal-insertion holes provided in the circuit board, wherein at least one positioning protrusion is provided on a bottom face of each of the electrical parts so that the position of the positioning protrusion differs according to the type of the electrical part, and a positioning hole in which the positioning protrusion is fitted is provided in a mounting region for the electrical part on the circuit board corresponding to the positioning protrusion.

By thus differentiating a plurality of types of electrical parts having similar terminal arrangements with the position of the positioning protrusion protruding from the bottom face, the electrical part are prevented from being improperly mounted on the circuit board because the positioning protrusions of the electrical parts can be inserted only in the corresponding positioning holes of the circuit board. Consequently, it is possible to prevent improper mounting without taking great care during mounting operation.

Preferably, each of the electrical parts includes a housing having the slider and the conductive pattern therein, and having the terminal protruding outward therefrom, and a bottom plate member attached to the bottom portion of the housing and having the positioning protrusion provided corresponding to a positioning hole of the circuit board. In this case, since the electrical parts can be differentiated with the shape of the bottom plate member attached to the bottom portion of the housing, they can share the housing including the slider, the terminals, and so on, and a cost merit will not be reduced.

Preferably, the positioning protrusion includes a plurality of positioning protrusion protruding from the bottom plate member, and a positioning protrusion protruding at the center of the bottom plate member is fitted in a corresponding positioning hole provided in the circuit board. In this case, the central positioning protrusion allows the electrical part to be precisely positioned with respect to the circuit board. However, since the electrical part cannot be differentiated from another electrical part with the central positioning protrusion, the position of the other positioning protrusion is appropriately changed depending on the type of the electrical part. Even when the electrical part has only one positioning protrusion protruding from the bottom plate member, as long as the positioning protrusion is provided apart from the center of the bottom plate member, it can perform both a function of positioning relative to the circuit board and a function of preventing improper mounting.

Preferably, the electrical parts are different in color of the bottom plate member. Since electrical parts that are similar in appearance can be thereby instantaneously distinguished, working efficiency during mounting is further improved.

Further objects, features and advantages of the present invention will become apparent from the following description of the preferred embodiments with reference to the attached drawings.

DESCRIPTION OF THE PREFERRED EMBODIMENTS

Figure 1:
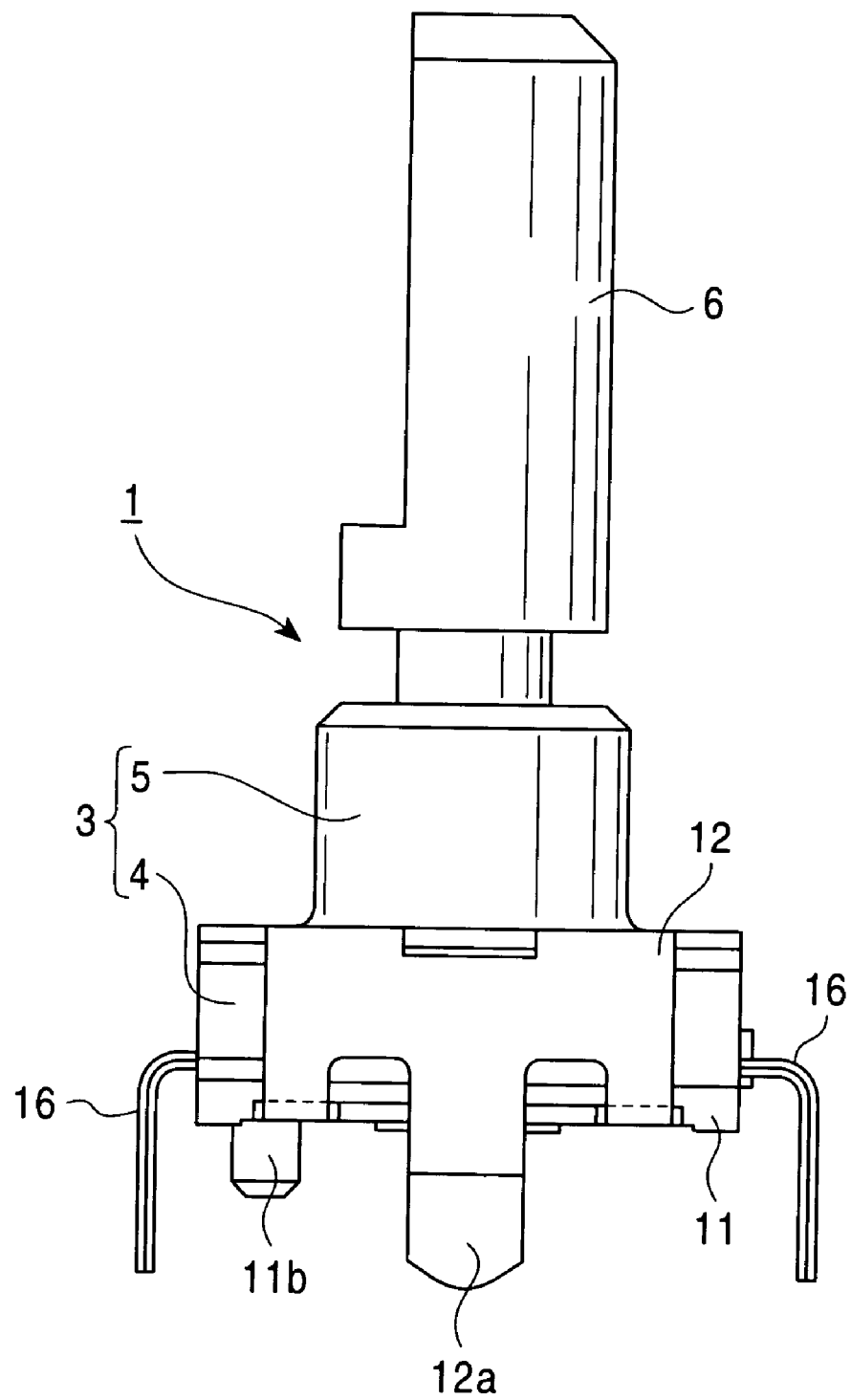
FIG. 1 is a side view of an electrical part according to an embodiment of the present invention.

An embodiment of the present invention will be described below with reference to the attached drawings.

Referring to FIGS. 1 to 4, an electrical part 1 according to an embodiment of the present invention is a rotary encoder with a push switch. The electrical part 1 includes a housing 3 having a wafer 4 and a bearing member 5 in combination, an operating member 6 rotatably supported by the bearing member 5, a driver 7 fixedly press-fitted on a lower end of the operating member 6, a rotator 8 spline-connected to the driver 7, a substantially frusto-conical rubber member 9 disposed on the wafer 4 to mount the driver 7 thereon, a movable contact member 10 held between an inner bottom face of the wafer 4 and a bottom face of the rubber member 9, a bottom plate member 11 covering a bottom face of the wafer 4, and a mounting plate 12 for attaching the bottom plate member 11 to the housing 3.

The wafer 4 is provided integrally with a plurality of sliders 13, a fixed contact 14, a common contact 15, terminals 16, and so on. The wafer 4 is insert-molded with a hoop material. The terminals 16 protruding out from the wafer 4 are passed through terminal-insertion holes 21 of a circuit board 20, which will be described later, during mounting. In this embodiment, three terminals 16 for an encoder protrude from one side wall of the wafer 4, and two terminals 16 for a push switch protrude from the other side wall thereof. The bearing member 5 is made of metal, and is fixed on the wafer 4. The lower end of the operating member 6, the driver 7, the rotator 8, the rubber member 9, the movable contact member 10, the sliders 13, and so on are disposed in an inner space of the housing 3 composed of the wafer 4 and the bearing member 5.

The operating member 6 is made of metal, and is rotatably supported by a cylindrical portion 5a of the bearing member 5. When the rotating member 6 is rotated, the driver 7 and the rotator 8 rotate together. The operating member 6 can move up and down relative to the housing 3. By pressing the operating member 6 downward, the rubber member 9 can be buckled through the driver 7. However, even when the driver 7 moves up and down, the rotator 8 spline-connected thereto does not move. Since a fall-preventive wire 17 is mounted in an annular groove 6a of the operating member 6, the operating member 6 will not fall off the bearing member 5 during its upward movement.

The bottom of the rotator 8 is formed by a code plate 8a, and a contact pattern 18 for the encoder is provided on the bottom face of the code plate 8a. In the contact pattern 18, a comb pattern protrudes on the outer periphery of an annular common pattern, and different sliders 13 are in sliding contact, respectively, with the common pattern and the comb pattern. An upper surface of the code plate 8a has pits and projections alternately formed in the circumferential direction, and a click spring 19 incorporated in the bottom of the bearing member 5 is in sliding contact with the pits and projections. Therefore, when the rotator 8 rotates, the click spring 19 engages with and disengages from the pits and projections to produce a tactile feeling. The rotator 8 rarely rattles in the vertical direction, but can stably rotate because the innermost peripheral portion of the code plate 8a is disposed on the wafer 4, and the code plate 8a is elastically biased downward by the click spring 19.

The rubber member 9 serves to return the pressed operating member 6 to the initial position, and produces a tactile feeling when it is buckled. Since the bottom face of the rubber member 9 presses the outer peripheral portion of the movable contact member 10 disposed on the common contact 15 from above, the movable contact member 10 and the common contact 15 are constantly and electrically connected. A tongue 10a of the movable contact member 10 disposed in the inner space of the rubber member 9 opposes the fixed contact 14 so that it can move into contact with and away from the fixed contact 14.

The bottom plate member 11 is molded from resin, and is provided with positioning protrusions 11a and 11b protruding, respectively, from a center portion and a peripheral portion of a bottom face thereof. The central positioning protrusion 11a has a diameter larger than that of the peripheral positioning protrusion 11b. The lengths of the protrusions 11a and 11b from the bottom face are substantially equal, and are shorter than the lengths of the terminals 16 and mounting pieces 12a which will be described later. During mounting, the positioning protrusions 11a and 11b are inserted, respectively in positioning holes 22 and 23 provided in the circuit board 20 which will be described later. A pair of mounting pieces 12a formed by bending protrude downward from the metal mounting plate 12, and are engaged with the circuit board 20 by being snapped in engaging holes 24 of the circuit board 20. The bottom plate member 11 is laid under the housing 3 so that a lower surface thereof opposes the circuit board 20. In this embodiment, the lower surface of the bottom plate member 11 is in contact with the upper surface of the circuit board 20.

The operation of the electrical part 1 having the above-described configuration will now be described. When the operating member 6 is rotated, the driver 7 and the rotator 8 rotate together, and therefore, the two sliders 13 that are spaced approximately 180° apart move into contact with and away from the comb pattern of the contact pattern 18, thereby outputting pulse signals. Since pulse signals with a predetermined phase difference therebetween are generated by the sliders 13, the amount and direction of rotation of the operating member 6 can be detected on the basis of the pulse signals. During such rotation, the click spring 19 engages with and disengages from the pits and projections of the code plate 8a to produce a tactile feeling, and the operator can roughly grasp the amount of rotation of the operating member 6 from the tactile feeling transmitted to the fingers.

In a case in which the operating member 6 is pressed, the rubber member 9 is pressed down through the driver 7, and therefore, a tapered wall of the rubber member 9 is buckled when the operating member 6 is moved down by a predetermined stroke. As a result, the center of the lower surface of the rubber member 9 presses the tongue 10a of the movable contact member 10 into contact with the fixed contact 14. The movable contact member 10 and the fixed contact 14 are thereby electrically connected to turn the push switch on. Since s tactile feeling is produced when the rubber member 9 is buckled, the operator can sense, from the tactile feeling transmitted to the fingers, that the push switch is turned on. When the pressing force exerted on the operating member 6 is removed, the buckled rubber member 9 returns to its initial frusto-conical shape, and pushes the driver 7 and the operating member 6 up to their initial positions. Moreover, since the tongue 10a of the movable contact member 10 separates from the fixed contact 14 by its elasticity, the push switch is automatically returned to an OFF state.

Figure 5:
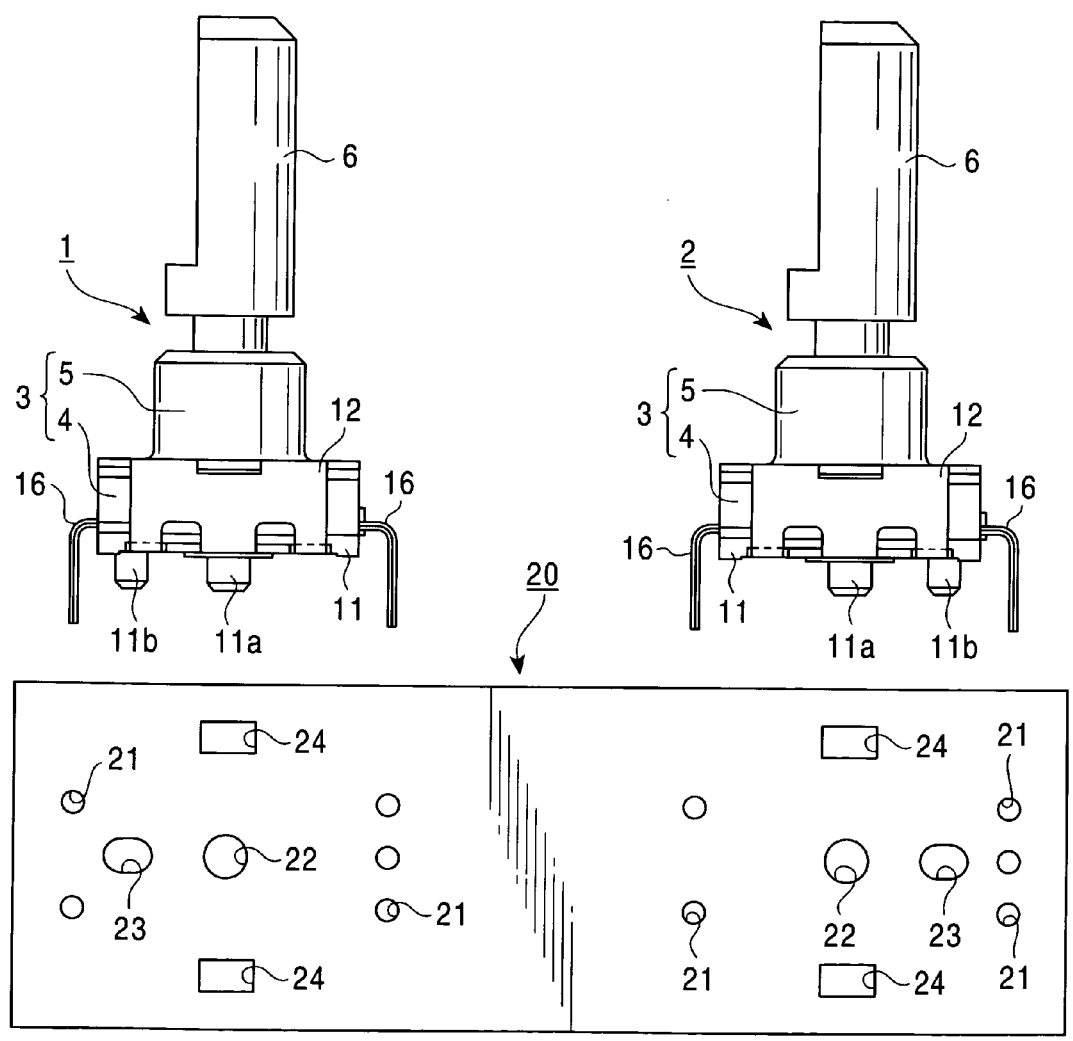
FIG. 5 is an explanatory view showing a state in which two types of electrical parts that are similar in appearance are mounted adjacent to each other on a circuit board.

A description will now be given of the mounting structure for the above-described electrical part 1. As shown in FIG. 5, a circuit board 20 on which the electrical part 1 is to be mounted includes, in a predetermined mounting region, a plurality of terminal-insertion holes 21 in which the terminals 16 of the electrical part 1 are to be inserted, a positioning hole 22 in which the positioning protrusion 11a is to be inserted, a positioning hole 23 in which the positioning protrusion 11b is to be inserted, and a pair of engaging holes 24 in which the mounting pieces 12a are to be inserted.

Figure 2:
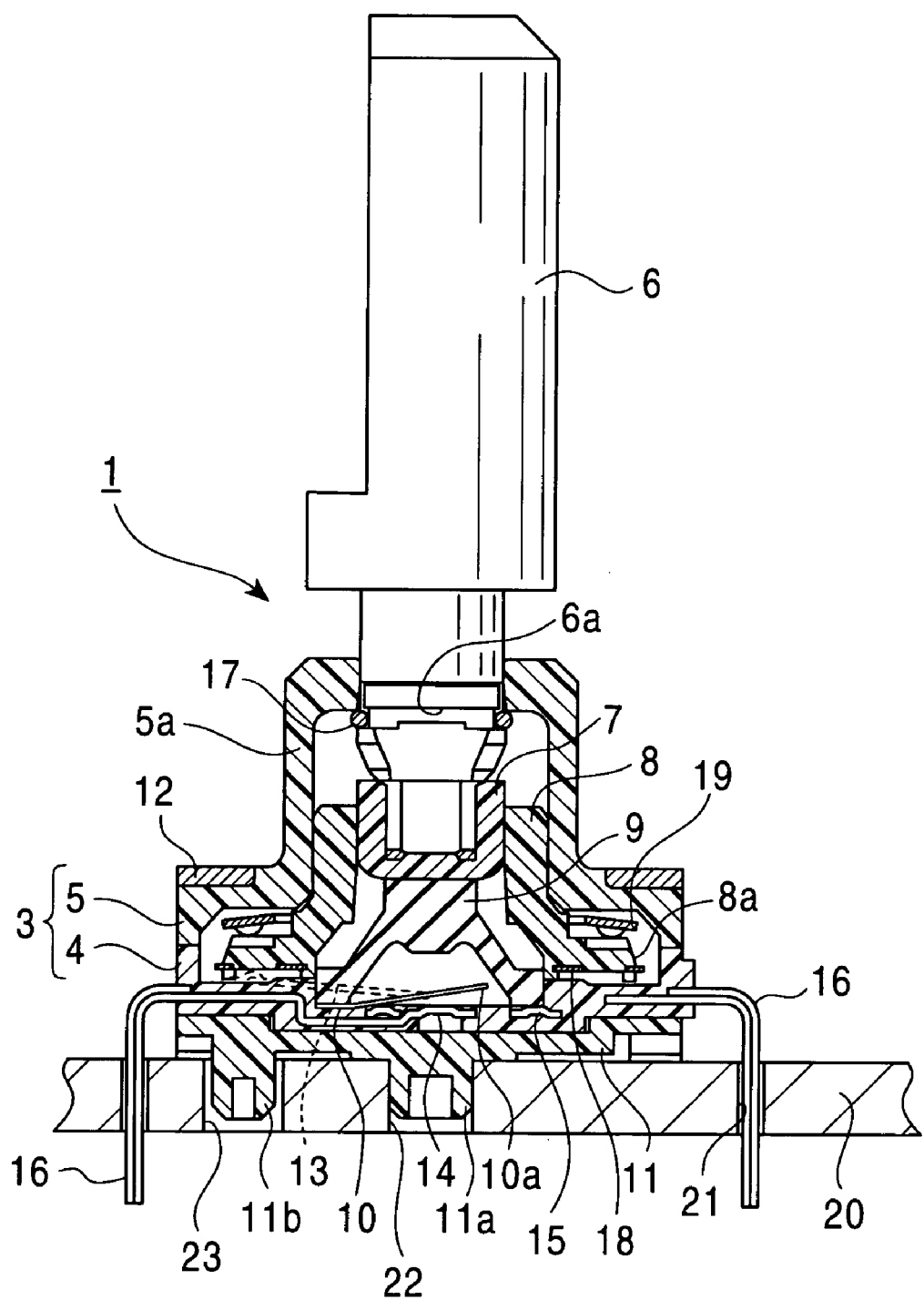
FIG. 2 is a cross-sectional view of the electrical part.
Figure 3:
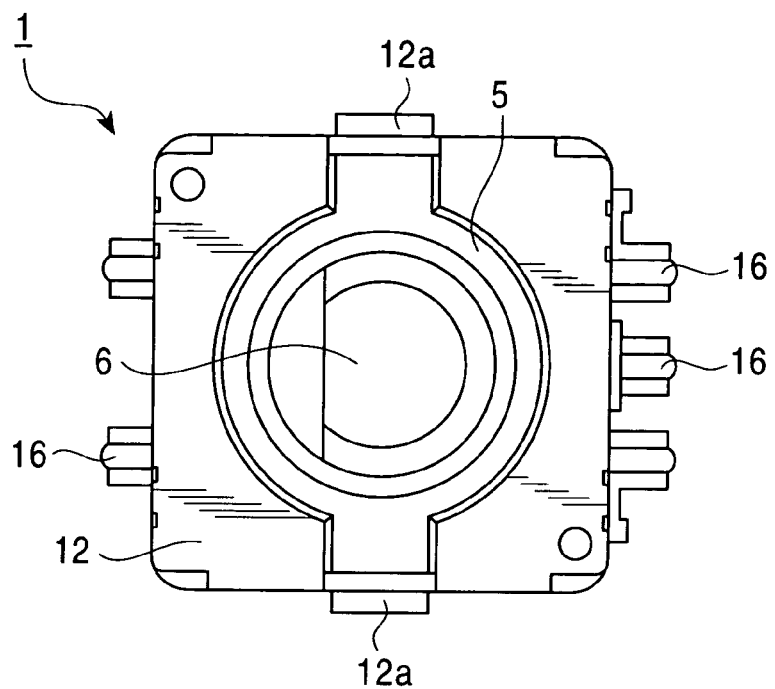
FIG. 3 is a plan view of the electrical part.
Figure 4:
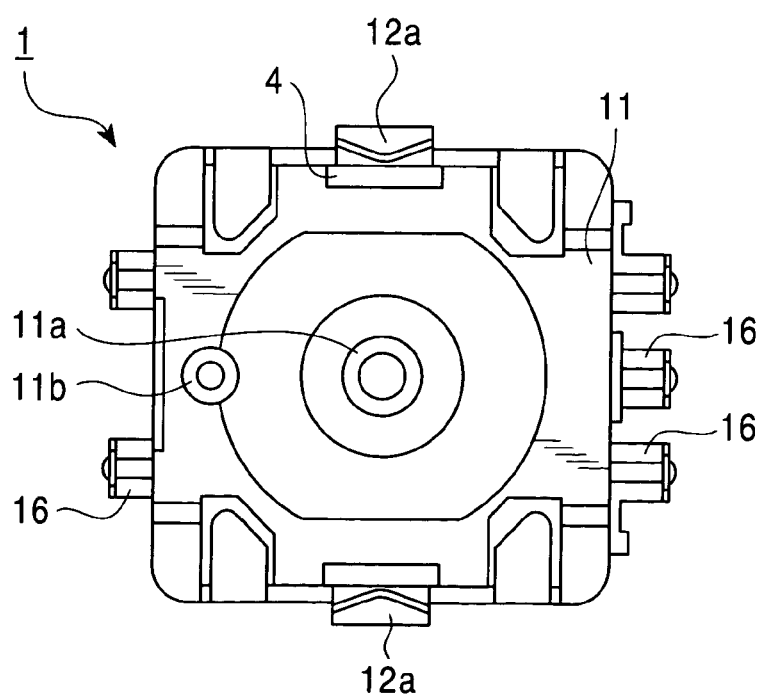
FIG. 4 is a bottom view of the electrical part.

In order to mount the electrical part 1 on the circuit board 20, first, the terminals 16 are aligned with and inserted in the corresponding terminal-insertion holes 21, and the mounting pieces 12a are aligned with and inserted in the engaging holes 24. When the terminals 16 are inserted in the terminal-insertion holes 21 to some degree, the positioning protrusion 11a at the bottom center of the electrical part 1 is allowed to be inserted in the positioning hole 22, and the positioning protrusion 11b at the peripheral bottom is allowed to be inserted in the positioning hole 23. When the terminals 16 are inserted further, the bottom plate member 11 is brought into contact with the circuit board 20, and the electrical part 1 is mounted on the circuit board 20 with the mounting pieces 12a snapped in, as shown in FIG. 2. Since the positioning protrusion 11a has a thickness such as to be rotatably fitted in the positioning hole 22, the electrical part 1 can be precisely aligned with the circuit board 20 by inserting the positioning protrusion 11a into the positioning hole 22. Since the positioning hole 23 is shaped like a slot so that the positioning protrusion 11b is loosely fitted therein, it can absorb dimensional errors of the wafer 4 molded from resin. However, if the positioning hole 23 is not provided at the position corresponding to the positioning protrusion 11b of the electrical part 1, the terminals 16 cannot be inserted deep into the terminal-insertion holes 21, and therefore, it is impossible to mount the electrical part 1 on the circuit board 20.

That is, as shown in FIG. 5, when another type of electrical part 2, which is similar in terminal arrangement and appearance to the electrical part 1, is mounted on the circuit board 20 adjacent to the electrical part 1, there is a risk of confusing and improperly mounting the electrical parts 1 and 2 of different types. Accordingly, in this embodiment, the position of the positioning protrusion 11b differs between the electrical parts 1 and 2 so that each of the electrical parts 1 and 2 can be mounted only in the predetermined mounting region of the circuit board 20. More specifically, while the positioning protrusion 11b of one of the electrical parts 1 is provided adjacent to one side at which two terminals 16 protrude from the bottom face of the bottom plate member 11, the positioning protrusion 11b of the other electrical part 2 is provided adjacent to one side at which three terminals 16 protrude from the bottom face of the bottom plate member 11. On the circuit board 20, the positioning hole 23 is provided adjacent to the two terminal-insertion holes 21 in a region for mounting the electrical part 1, and the positioning hole 23 is provided adjacent to three terminal-insertion holes 21 in a region for mounting the electrical part 2.

Therefore, even when an attempt is made to mount the electrical part 2 in the region for the electrical part 1, mounting is impossible because the positioning protrusion 11*b* of the electrical part 2 cannot be inserted in the positioning hole 23 for the electrical part 1. Consequently, an assembler immediately notices the mistake. Similarly, even when an attempt is made to mount the electrical part 1 in the region for the electrical part 2, mounting is impossible because the positioning protrusion 11*b* of the electrical part 1 cannot be inserted in the positioning hole 23 for the electrical part 2. This makes it possible to prevent two types of electrical parts 1 and 2, which are similar in terminal arrangement and appearance, from being improperly mounted, without taking great care during operation, and to easily and precisely mount the electrical parts 1 and 2. In this embodiment, the bottom plate member 11 differs between the electrical parts 1 and 2 not only in shape, but also in color (for example, black and gray). Therefore, the assembler can distinguish between the electrical parts 1 and 2 in an instant. This further improves working efficiency.

In this embodiment, one of the electrical parts 1 is an encoder in which the total number of pulses is 30 and which is used to adjust the volume, and the other electrical part 2 is an encoder in which the total number of pulses is 18 and which is used to switch the mode. Since these electrical parts 1 and 2 as the encoders have different functions, the comb pattern of the contact pattern 18 and the pits and projections for a tactile feeling in the code plate 8*a* of the rotator 8 differ therebetween. Moreover, the shape of the bottom plate member 11 (the position of the positioning protrusion 11*b*) differs therebetween in order to prevent improper mounting. Other structures are substantially equivalent. For example, the wafer 4 may have just the same structure including the sliders 13, the contacts 14 and 15, the terminals 16, and so on. Since the electrical parts 1 and 2 share most components in this way, they can be produced at low cost.

In the case of the electrical part having a structure in which the base portions of the sliders 13 are embedded in the bottom of the wafer 4, as in this embodiment, the bottom face of the wafer 4 needs to have an aperture (not shown) in order to subject the sliders 13 to, for example, bending. The aperture must be closed by a bottom cover to prevent the entry of flux or the like during soldering. Accordingly, improper mounting can be prevented at low cost without increasing the number of components, by providing the positioning protrusion 11*b* on the bottom plate member 11 serving as the bottom cover.

Of the two positioning protrusions 11*a* and 11*b* protruding from the bottom face of the bottom plate member 11, the positioning protrusion 11*a* at the center allows an electrical part to be precisely positioned with respect to the circuit board 20, and the positioning protrusion 11*b* in the peripheral portion prevents improper mounting. That is, since an electrical part cannot be differentiated from another electrical part with the central positioning protrusion 11*a*, the position of the peripheral positioning protrusion 11*b* is appropriately changed depending on the type of the electrical part. Even when the electrical part has only one positioning protrusion protruding from the bottom face of the bottom plate member, as long as the positioning protrusion is provided apart from the center of the bottom plate member 11, it can perform both a function of positioning relative to the circuit board 20 and a function of preventing improper mounting.

While the present invention has been described with reference to what is presently considered to be the preferred embodiment, it is to be understood that the invention is not limited to the disclosed embodiment. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An electrical-part mounting structure for mounting electrical parts of different types on a circuit board, wherein each of the electrical parts includes a slider, a conductive pattern on which the slider slides, and an operating member rotatable together with the slider or the conductive pattern, wherein terminals of the electrical parts have similar arrangements and extend through terminal-insertion holes provided in the circuit board, wherein at least one positioning protrusion is provided on a bottom face of each of the electrical parts so that the position of the positioning protrusion differs according to the type of the electrical part, and wherein a positioning hole in which the positioning protrusion is fitted is provided in a mounting region for the electrical part on the circuit board corresponding to the positioning protrusion, wherein each of the electrical parts includes a wafer, and the wafer is provided integrally with the terminals protruding outward, and wherein a structure of the wafer is the same among the electrical parts.

2. An electrical-part mounting structure according to claim 1, wherein each of the electrical parts comprises:

a housing having the slider and the conductive pattern therein, and having the terminals protruding outward therefrom; and a bottom plate member attached to a bottom portion of the housing and having the positioning protrusion provided corresponding to the positioning hole of the circuit board.

3. An electrical-part mounting structure according to claim 2, said at least one positioning protrusion comprises a plurality of positioning protrusions protruding from the bottom plate member, and a positioning protrusion provided at the center of the bottom plate member is fitted in a corresponding positioning hole provided in the circuit board.

4. An electrical-part mounting structure according to claim 2, wherein the electrical parts are different in color of the bottom plate member.

5. An electrical-part mounting structure according to claim 1, wherein a distal end of the positioning protrusion does not extend to or beyond a surface of the circuit board.

* * * * *